(12) United States Patent
Ito et al.

(10) Patent No.: US 11,211,277 B2
(45) Date of Patent: Dec. 28, 2021

(54) SUBSTRATE PROCESSING APPARATUS

(71) Applicant: KOKUSAI ELECTRIC CORPORATION, Tokyo (JP)

(72) Inventors: Takeshi Ito, Toyama (JP); Takayuki Nakada, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 224 days.

(21) Appl. No.: 16/248,411

(22) Filed: Jan. 15, 2019

(65) Prior Publication Data
US 2019/0221453 A1 Jul. 18, 2019

(30) Foreign Application Priority Data

Jan. 17, 2018 (JP) .............................. JP2018-005411

(51) Int. Cl.
*H01L 21/677* (2006.01)
*B65G 17/12* (2006.01)
*B65G 1/04* (2006.01)

(52) U.S. Cl.
CPC .......... *H01L 21/6773* (2013.01); *B65G 17/12* (2013.01); *H01L 21/67712* (2013.01);
(Continued)

(58) Field of Classification Search
CPC ........... H01L 21/6773; H01L 21/67712; H01L 21/67736; H01L 21/67769; B65G 17/12; B65G 1/0407
See application file for complete search history.

(56) References Cited

U.S. PATENT DOCUMENTS 6,009,890 A * 1/2000 Kaneko ............. H01L 21/67173
134/133
10,319,621 B2 * 6/2019 Oosterlaken ...... H01L 21/67778
(Continued)

FOREIGN PATENT DOCUMENTS

JP 2008-270266 A 11/2008
JP 2012-205748 A 10/2012
(Continued)

OTHER PUBLICATIONS

Taiwanese Office Action dated Apr. 22, 2020 for the Taiwanese Patent Application No. 107138284.
(Continued)

*Primary Examiner* — Saul Rodriguez
*Assistant Examiner* — Ashley K Romano
(74) *Attorney, Agent, or Firm* — Volpe Koenig (57) ABSTRACT

There is provided a substrate processing apparatus including: a transfer region communicating with a process chamber where substrates are processed; a first shelf region installed above the transfer region and having a first shelf storing transfer vessels accommodating the substrates; a second shelf region installed below a stage part where the vessels to be transferred to and from an external device are loaded, and having a second shelf stacking and storing the transfer vessels; and a transfer vessel transfer robot installed inside a housing accommodating the transfer region, the first shelf region and the second shelf region and transferring the vessels to and from the stage part, the first shelf, the second shelf, and the transfer region. The transfer vessel transfer robot includes: a main body base part; a first table part; a first driving part; a second table part; a second driving part; and a vessel support part.

19 Claims, 7 Drawing Sheets

(52) U.S. Cl.
CPC .. *H01L 21/67736* (2013.01); *H01L 21/67769* (2013.01); *B65G 1/0407* (2013.01)

(56) References Cited

U.S. PATENT DOCUMENTS

| | | | | |
|---|---|---|---|---|
| 2002/0009357 A1* | 1/2002 | Hanson | ............ | H01L 21/67769 414/639 |
| 2002/0071744 A1* | 6/2002 | Bachrach | .......... | H01L 21/67775 414/217 |
| 2003/0051974 A1* | 3/2003 | Davis | ............... | H01L 21/67769 198/345.3 |
| 2007/0138466 A1* | 6/2007 | Lee | .................. | H01L 21/67769 257/48 |
| 2007/0295274 A1* | 12/2007 | Webb | ............... | H01L 21/67173 118/719 |
| 2007/0296134 A1* | 12/2007 | Horiguchi | ......... | H01L 21/67236 271/3.2 |
| 2008/0014061 A1* | 1/2008 | Izumi | ............... | H01L 21/67769 414/281 |
| 2008/0124201 A1* | 5/2008 | Izumi | .................... | B65G 1/045 414/280 |
| 2008/0260502 A1* | 10/2008 | Aburatani | ......... | H01L 21/67769 414/226.04 |
| 2009/0003825 A1* | 1/2009 | Ueda | ................ | H01L 21/67769 396/647 |
| 2009/0003977 A1* | 1/2009 | Aburatani | ......... | H01L 21/67742 414/217 |
| 2009/0022575 A1* | 1/2009 | Tsuge | ................ | H01L 21/67727 414/679 |
| 2009/0053665 A1* | 2/2009 | Haraki | ............. | H01L 21/67109 432/1 |
| 2011/0146578 A1* | 6/2011 | Taniyama | ............... | C23C 16/54 118/725 |
| 2015/0255319 A1 | 9/2015 | Kikuchi et al. | | |
| 2016/0379858 A1* | 12/2016 | Nogami | ............ | H01L 21/67766 414/217.1 |
| 2017/0140964 A1 | 5/2017 | Nagata et al. | | |
| 2017/0352556 A1* | 12/2017 | Komae | .................. | H01L 21/677 |

FOREIGN PATENT DOCUMENTS

| | | |
|---|---|---|
| JP | 2014-060337 A | 4/2014 |
| JP | 2014-060338 A | 4/2014 |
| JP | 2015-170623 A | 9/2015 |
| KR | 10-2015-0104047 A | 9/2015 |
| TW | 201131684 A | 9/2011 |
| TW | 201729335 A | 8/2017 |
| WO | 2015/141793 A1 | 9/2015 |

OTHER PUBLICATIONS

Singapore Written Opinion dated Aug. 20, 2020 for Singapore Patent Application No. 10201900413Y.
Japanese Office Action dated Dec. 4, 2019 for the Japanese Patent Application No. 2018-005411.

* cited by examiner

SUBSTRATE PROCESSING APPARATUS

CROSS-REFERENCE TO RELATED APPLICATION

This application is based upon and claims the benefit of priority from Japanese Patent Application No. 2018-005411, filed on Jan. 17, 2018, the entire contents of which are incorporated herein by reference.

TECHNICAL FIELD

The present disclosure relates to a substrate processing apparatus.

BACKGROUND

In the related art, a substrate processing apparatus used in a manufacturing process of a semiconductor device is configured to transfer a substrate to be processed or a processed substrate using a transfer vessel called a front open unified pod (FOUP) (hereinafter, simply referred to as a "pod").

SUMMARY

The present disclosure provides some embodiments of a technique of a substrate processing apparatus capable of appropriately coping with an increase in storage capacity of a transfer vessel.

According to one embodiment of the present disclosure, there is provided a technique that includes: a transfer region configured to communicate with a process chamber in which a substrates are processed; a first shelf region installed above the transfer region, and having a first shelf configured to store a plurality of transfer vessels configured to accommodate the substrates; a second shelf region installed below a stage part on which the transfer vessels to be transferred to and from an external device are loaded, and having a second shelf configured to stack and store the transfer vessels; and a transfer vessel transfer robot installed inside a housing that accommodates the transfer region, the first shelf region and the second shelf region, and configured to transfer the transfer vessels to and from the stage part, the first shelf, the second shelf, and the transfer region, wherein the transfer vessel transfer robot includes: a main body base part installed on a bottom surface of the housing; a first table part configured to be moved up and down with respect to the main body base part; a first driving part disposed at an upper position of the main body base part and configured to serve as a driving source for moving the first table part up and down; a second table part mounted on the first table part and configured to be moved up and down with respect to the first table part; a second driving part configured to serve as a driving source for moving the second table part up and down; and a vessel support part mounted on the second table part and configured to support the transfer vessels to be transferred.

DETAILED DESCRIPTION

One Embodiment of the Present Disclosure

An embodiment of the present disclosure will now be described with reference to the drawings.

(1) Overview of the Substrate Processing Apparatus

First, an overview of a substrate processing apparatus according to an embodiment of the present disclosure will be briefly described.

The substrate processing apparatus described in the present embodiment is used in a manufacturing process of a semiconductor device, and processes a substrate by heating it with a heater, with the substrate to be processed accommodated in a process chamber. More specifically, the substrate processing apparatus is a vertical type substrate processing apparatus that simultaneously processes a plurality of substrates stacked at predetermined intervals in a vertical direction.

The substrate to be processed by the substrate processing apparatus may be, for example, a semiconductor wafer substrate (hereinafter, simply referred to as a "wafer") in which a semiconductor integrated circuit device (semiconductor device) is embedded. Examples of processing performed by the substrate processing apparatus may include oxidation treatment, diffusion treatment, reflow or annealing for carrier activation or planarization after ion implantation, a film-forming process by thermal chemical vapor deposition (CVD) reaction, and the like.

(2) Schematic Configuration of the Substrate Processing Apparatus

Next, a schematic configuration example of the substrate processing apparatus according to one embodiment of the present disclosure will be described.

(Overall Apparatus)

Figure 1:
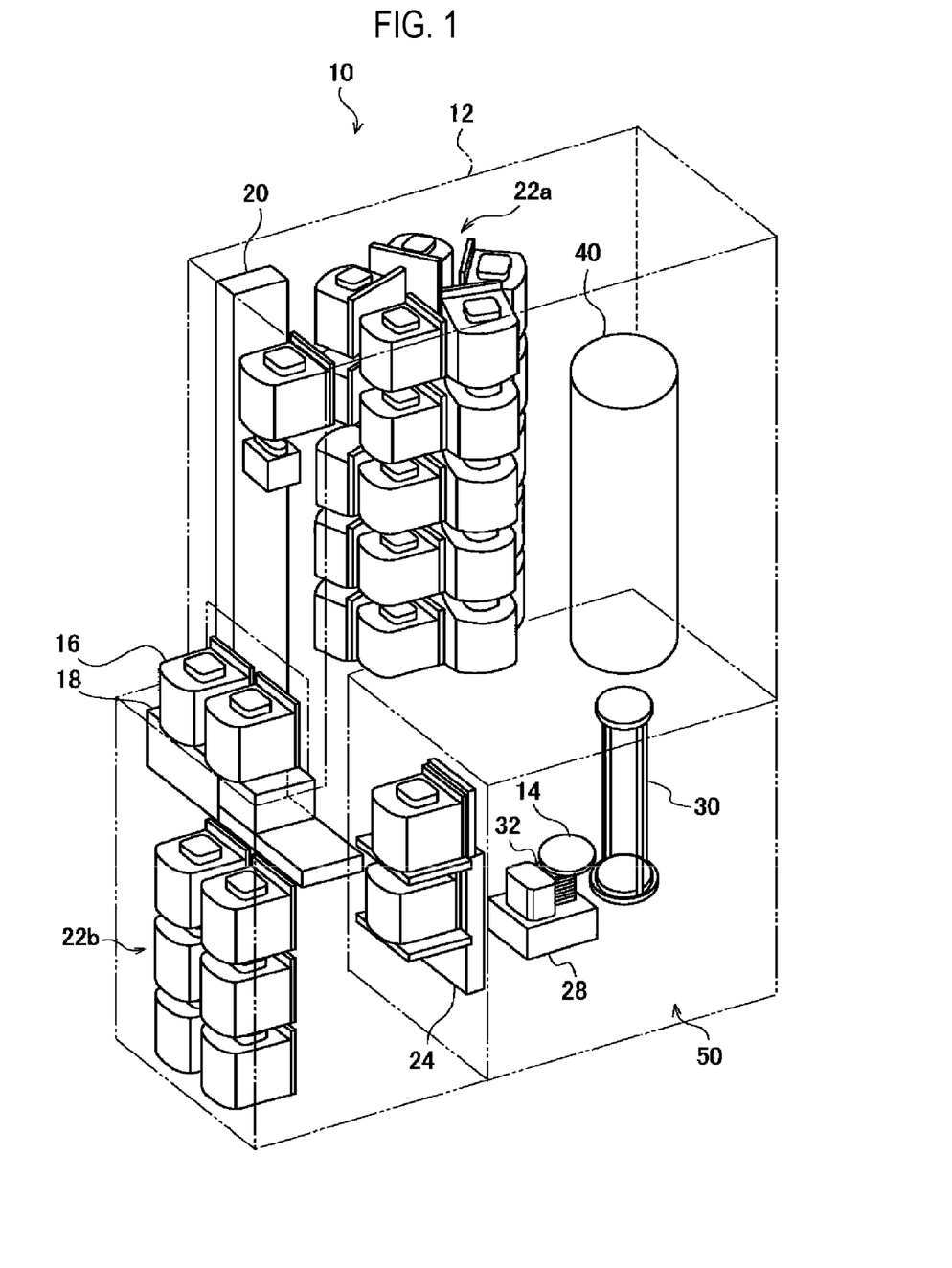
FIG. 1 is an oblique perspective view illustrating a configuration example of a substrate processing apparatus according to an embodiment of the present disclosure.

FIG. 1 is an oblique perspective view illustrating a configuration example of the substrate processing apparatus according to one embodiment of the present disclosure.

A substrate processing apparatus 10 includes a housing 12 in which a main part such as a process furnace 40 is disposed. A pod stage 18 called an overhead hoist transport (OHT) stage is disposed on a front side of the housing 12. A pod 16 serving as a transfer vessel for accommodating a wafer 14 is transferred to and loaded on the pod stage 18. The pod 16 has, e.g., 25 wafers 14 accommodated therein, and is configured to be loaded on the pod stage 18 with a lid (not shown) closed. That is, in the substrate processing apparatus 10, the pod 16 is used as a wafer carrier, and it is configured such that the transfer is performed between an external device (for example, a pod transfer system) and the pod 16 using the pod stage 18 as a stage part on which the pod 16 is loaded.

A pod transfer device 20 as a transfer vessel transfer robot for transferring the pod 16 is disposed on the front side inside the housing 12 at a position facing the pod stage 18. A rotary pod shelf 22a as a first shelf capable of storing the pod 16, a stacked pod shelf 22b as a second shelf capable of storing the pod 16, and a pod opener 24 are each disposed near the pod transfer device 20.

The pod transfer device 20 is configured to transfer the pod 16 between the pod stage 18, the rotary pod shelf 22a, the stacked pod shelf 22b, and the pod opener 24.

The rotary pod shelf 22a is disposed in a first shelf region which is a region above the pod opener 24, and is configured to support a plurality of pods 16 loaded thereon. It may be considered that the rotary pod shelf 22a has a plurality of stages (e.g., five stages) of shelf boards, and is configured by a so-called rotary shelf which is pitch-fed and rotated in one direction by an intermittent rotary driving device (not shown) such as a motor. However, the rotation function is not necessary. In addition, a clean unit including a supply fan and a dustproof filter may be installed near the rotary pod shelf 22a so that clean air, which is a cleaned atmosphere, is circulated from the clean unit.

The stacked pod shelf 22b is disposed in a second shelf region which is a region below the pod stage 18, and is configured to support a plurality of pods 16 loaded thereon. It may be considered that the stacked pod shelf 22b is configured by a so-called stacked shelf which has a plurality of stages (e.g., three stages) of shelf boards, and on which the pods 16 are loaded on the respective shelf boards. At least one shelf board (e.g., the lowermost shelf board) among the plurality of stages of shelf boards in the stacked pod shelf 22b may be configured to manually load the pods 16 from the front side of the housing 12. Similar to the rotary pod shelf 22a, it may also be configured such that clean air is circulated near the stacked pod shelf 22b.

The pod opener 24 is configured to open the lid of the pod 16. In addition, a substrate number detector for detecting the number of wafers 14 in the pod 16 with the lid opened may be disposed adjacent to the pod opener 24.

A transfer chamber 50 as a transfer region, which is defined as one room in the housing 12, is formed on the rear side in the housing 12 rather than the pod opener 24.

A substrate transfer device 28 and a boat 30 as a substrate support are disposed in the transfer chamber 50.

The substrate transfer device 28 has an arm (tweezer) 32 capable of discharging, e.g., five wafers 14. It is configured such that the wafers 14 can be transferred between the pod 16 placed at the position of the pod opener 24 and the boat 30 by vertically rotating the arm 32 by a driving part (not shown).

The boat 30 is configured to support a plurality of wafers 14 (e.g., about 50 to 175 wafers), in such a state that the wafers 14 are arranged in a horizontal posture and stacked at predetermined intervals along a vertical direction with the centers of the wafers 14 aligned with one another. The boat 30 supporting the wafers 14 is configured to be moved up and down by a boat elevator as an elevating mechanism (not shown).

A process furnace 40 is disposed at an upper rear side in the housing 12, i.e., above the transfer chamber 50. The aforementioned boat 30 charged with the plurality of wafers 14 is configured in the process furnace 40 so as to be loaded from below.

(Process Furnace)

Next, the process furnace 40 described above will be briefly described.

Figure 2:
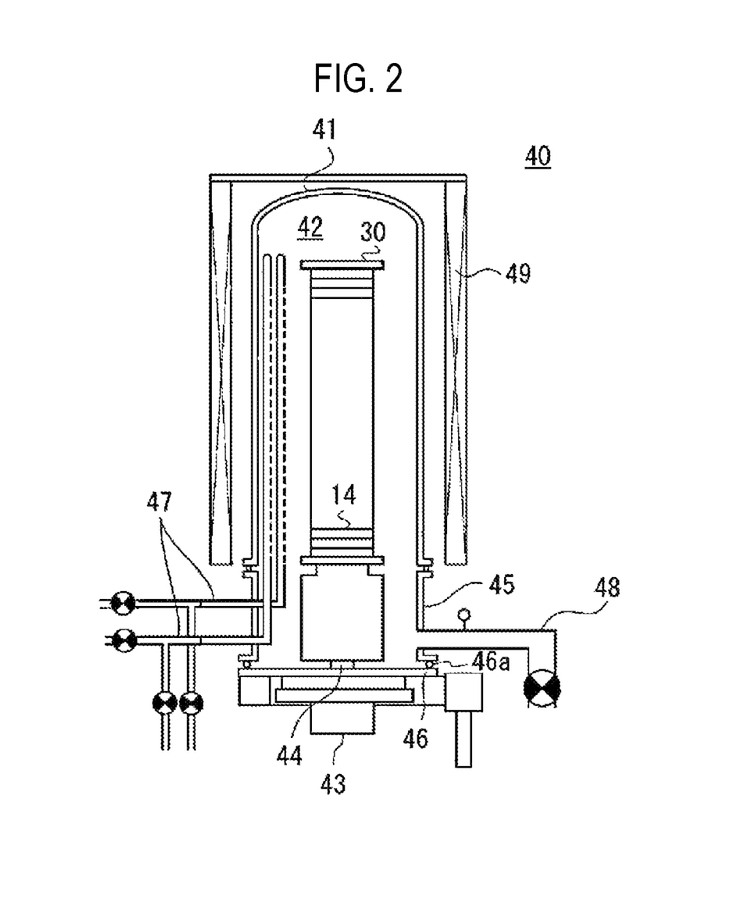
FIG. 2 is a vertical cross sectional view illustrating a configuration example of a process furnace used in the substrate processing apparatus according to an embodiment of the present disclosure.

FIG. 2 is a vertical cross sectional view illustrating a configuration example of the process furnace used in the substrate processing apparatus according to one embodiment of the present disclosure.

The process furnace 40 has a reaction tube 41. The reaction tube 41 is made of a heat resistant non-metallic material such as, e.g., quartz ($SiO_2$), silicon carbide (SiC) or the like, and has a cylindrical shape with its upper end closed and its lower end opened.

A process chamber 42 is formed in the cylinder of the reaction tube 41. The boat 30 as a substrate support is inserted into the process chamber 42 from below so as to be accommodated, in such a state that the wafers 14 supported by the boat 30 in the horizontal posture are stacked along the vertical direction. The boat 30 accommodated in the process chamber 42 is configured to be rotatable by rotating the rotary shaft 44 with the rotation mechanism 43, with the wafers 14 mounted while keeping hermeticity in the process chamber 42.

A manifold 45 is disposed below the reaction tube 41 in a concentric relationship with the reaction tube 41. The manifold 45 is made of a metal material such as, e.g., stainless steel (SUS), and has a cylindrical shape with its upper and lower ends opened. By this manifold 45, the reaction tube 41 is vertically supported from the lower end side. That is, the reaction tube 41 forming the process chamber 42 is erected in the vertical direction through the manifold 45 to form the process furnace 40.

A lower end portion of the manifold 45 is configured to be hermetically sealed by a seal cap 46 when a boat elevator (not shown) moves up. A seal member 46a such as an O-ring for hermetically sealing the interior of the process chamber 42 is installed between the lower end portion of the manifold 45 and the seal cap 46.

In addition, a gas introduction pipe 47 for introducing a precursor gas, a purge gas or the like into the process chamber 42 and an exhaust pipe 48 for exhausting the gas in the process chamber 42 are each connected to the manifold 45.

A heater unit 49 as a heating means (heating mechanism) is disposed on the outer periphery of the reaction tube 41 to be concentric with the reaction tube 41. The heater unit 49 is configured to heat the inside of the process chamber 42 so that the interior of the process chamber 42 is uniform in temperature or has a predetermined temperature distribution over the whole.

(3) Overview of Substrate Processing

Next, an operation procedure when processing is performed on a wafer 14 using the substrate processing apparatus 10 according to the present embodiment, which is one of the processes for manufacturing a semiconductor device, will be described.

(Pod Transfer Step)

When processing is performed on a wafer 14 in the substrate processing apparatus 10, first, the pod 16 accommodating a plurality of wafers 14 is loaded on the pod stage 18. Then, the pod 16 is transferred from the pod stage 18 to the rotary pod shelf 22a or the stacked pod shelf 22b by the pod transfer device 20.

(Wafer Supply Step)

Thereafter, the pod 16 loaded on the rotary pod shelf 22a or the stacked pod shelf 22b is transferred to the pod opener 24 by the pod transfer device 20. Then, the lid of the pod 16 is opened by the pod opener 24, and the number of wafers 14 accommodated in the pod 16 is detected by the substrate number detector.

(Transfer Step before Loading)

When the pod opener 24 opens the lid of the pod 16, then the substrate transfer device 28 disposed in the transfer chamber 50 discharges the wafers 14 from the pod 16. Then, unprocessed wafers 14 discharged from the pod 16 are transferred to the boat 30 located in the transfer chamber 50 in the same manner as the substrate transfer device 28. That is, the substrate transfer device 28 performs a wafer charging operation that charges the unprocessed wafers 14 into the boat 30 prior to being loaded into the process chamber 42 in the transfer chamber 50. Accordingly, the boat 30 supports the plurality of wafers 14 in a stacked state in which the wafers 14 are spaced apart from each other in the vertical direction. The number of wafers 14 that the boat 30 supports in a stacked state and processes at a time may be, e.g., 50 to 175. Thus, it is possible to enhance the mass productivity.

(Loading Step)

After the wafer charging operation, the boat 30 supporting a plurality of unprocessed wafers 14 is loaded into the process chamber 42 by an elevating operation of the boat elevator (boat loading). That is, the boat 30 supporting the unprocessed wafers 14 is loaded into the process chamber 42 from the interior of the transfer chamber 50 by operating the boat elevator. Thus, the seal cap 46 seals the lower end of the manifold 45 through the seal member 46a.

(Processing Step)

After the boat loading, predetermined processing is performed on the unprocessed wafers 14 supported by the boat 30 loaded into the process chamber 42. Specifically, for example, in the case of performing a film-forming process by thermal CVD reaction, exhaust is performed using the exhaust pipe 48 so that the interior of the process chamber 42 has a desired pressure (degree of vacuum). Then, the interior of the process chamber 42 is heated by using the heater unit 49, the boat 30 is rotated by operating the rotation mechanism 43, and the wafers 14 are also rotated accordingly. The rotation of the wafers 14 is continuously performed until the wafers 14 are unloaded, which will be described later. Furthermore, a precursor gas, a purge gas, or the like is supplied into the process chamber 42 through the gas introduction pipe 47. Thus, formation of a thin film using decomposition reaction, chemical reaction or the like by heat is performed on the surfaces of the unprocessed wafers 14 supported by the boat 30.

After the formation of the thin film on the surfaces of the wafers 14 is completed, overheating by the heater unit 49 is stopped, and the temperature of the processed wafers 14 is lowered to a predetermined temperature. Then, when a preset time has elapsed, the supply of the gas into the process chamber 42 is stopped, and the supply of an inert gas into the process chamber 42 starts. Thus, the interior of the process chamber 42 is substituted by an inert gas and the internal pressure of the process chamber 42 is returned to an atmospheric pressure.

(Unloading Step)

Thereafter, the seal cap 46 is moved down by the elevating operation of the boat elevator to open the lower end of the manifold 45. The boat 30 supporting the processed wafers 14 is unloaded from the lower end of the manifold 45 to the outside of the process chamber 42 (boat unloading). That is, the boat 30 supporting the processed wafers 14 is unloaded from the interior of the process chamber 42 to the interior of the transfer chamber 50 by operating the boat elevator. Then, the boat 30 waits at a predetermined position until all the wafers 14 supported by the boat 30 are cooled down.

(Transfer Step after Unloading)

After the wafers 14 of the boat 30 that waited are cooled to a predetermined temperature (e.g., about a room temperature), the substrate transfer device 28 disposed in the transfer chamber 50 performs dismounting of the wafers 14 from the boat 30. Then, the processed wafers 14 dismounted from the boat 30 are transferred to and accommodated in an empty pod 16 loaded on the pod opener 24. That is, the substrate transfer device 28 performs a wafer discharging operation which discharges the processed wafers 14 supported by the boat 30 unloaded from the interior of the process chamber 42 from the boat 30 and transfers them to the pod 16, in the transfer chamber 50.

Thereafter, the pod 16 accommodating the processed wafers 14 is transferred onto the rotary pod shelf 22a, the stacked pod shelf 22b, or the pod stage 18 by the pod transfer device 20.

In this manner, the series of operations of the substrate processing by the substrate processing apparatus 10 according to the present embodiment are completed.

(4) Characteristic Configuration of the Substrate Processing Apparatus

Next, a characteristic configuration example of the substrate processing apparatus 10 according to the present embodiment will be described.

Figure 3:
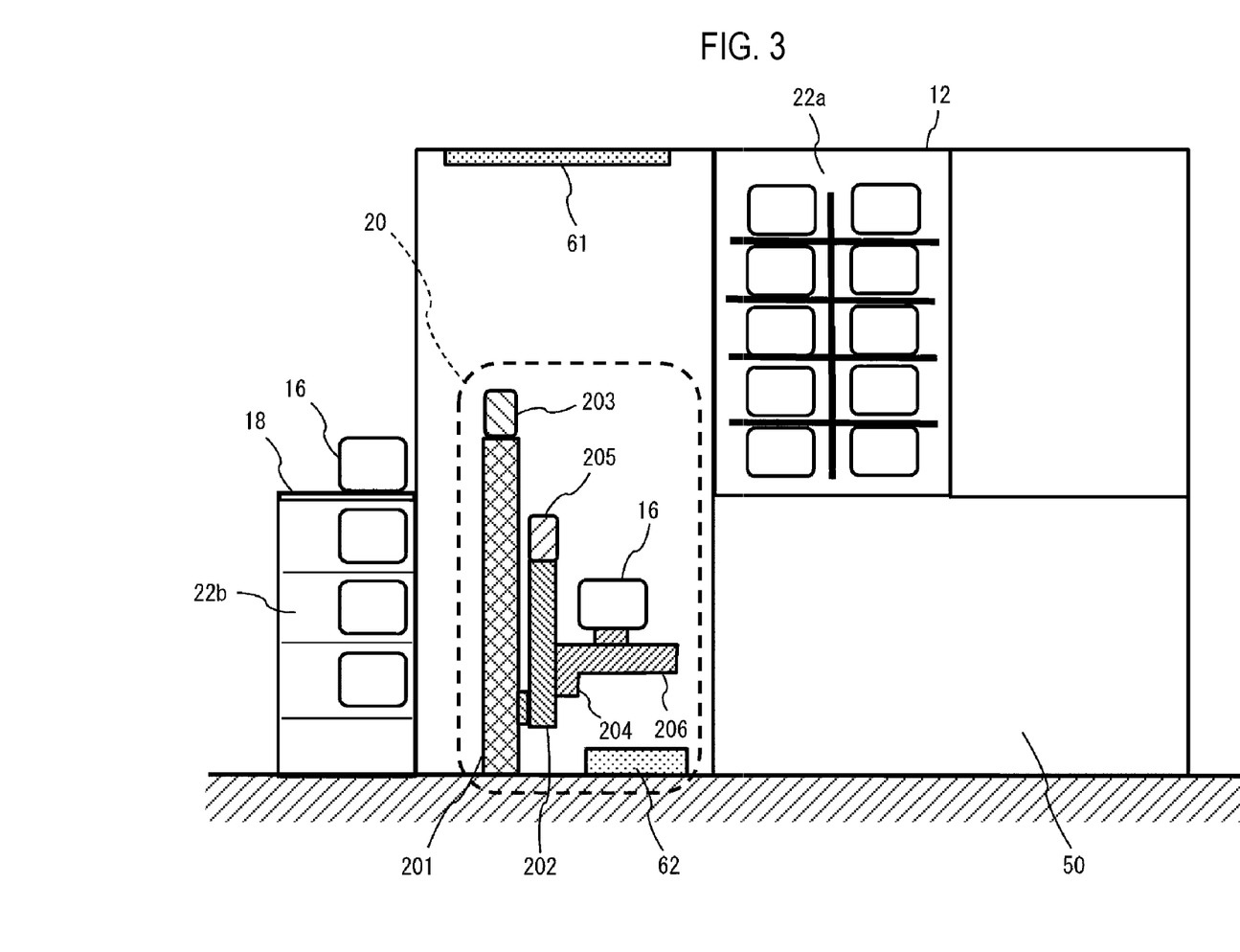
FIG. 3 is a side cross sectional view schematically illustrating a configuration example of the substrate processing apparatus according to an embodiment of the present disclosure.

FIG. 3 is a side cross sectional view schematically illustrating a configuration example of the substrate processing apparatus according to one embodiment of the present disclosure.

(Pod Shelf)

As described above, in the substrate processing apparatus 10, the pod 16 loaded on the pod stage 18 is transferred to and stored in the rotary pod shelf 22a or the stacked pod shelf 22b once. In the substrate processing apparatus 10 that performs such a processing operation, in order to improve the processing efficiency of the wafers 14, more pods 16 may be stored (stocked) in the apparatus.

Therefore, the rotary pod shelf 22a disposed in the first shelf region, which is a region above the pod opener 24 or the transfer chamber 50, is configured to have a plurality of stages (e.g., five stages) of shelf boards. However, the number of stages of shelf boards of the rotary pod shelf 22a is limited due to the size of the housing 12 in the height direction.

Accordingly, in the substrate processing apparatus 10, the stacked pod shelf 22b having a plurality of stages (e.g., three stages) of shelf boards is also disposed in the second shelf region below the pod stage 18 which is a region accessible by the pod transfer device 20, thereby increasing the number of pods 16 that can be stored in the apparatus.

(Pod Transfer Device)

When increasing the number of pods 16 that can be stored in the apparatus, the pod transfer device 20 that transfers the pod 16 may cope with an increase in distance between the lowermost position and the uppermost position in some embodiments. Therefore, the pod transfer device 20 is configured to have a main body base part 201, a first table part 202, a first driving part 203, a second table part 204, a second driving part 205, and a vessel support part 206.

The main body base part 201 is installed on a bottom surface of the housing 12 so as to extend in the longitudinal direction (i.e., the vertical direction) in which the pod 16 moves.

The first table part 202 is configured to be moved up and down with respect to the main body base part 201 using a guide rail as a guide mechanism and a ball screw as a drive transmission mechanism (not shown) installed in the main body base part 201.

The first driving part 203 is formed of a motor or the like as a driving source for moving the first table part 202 up and down. The first driving part 203 is connected to the ball screw as a drive transmission mechanism in the main body base part 201 through a connection mechanism (coupling or the like) (not shown).

The second table part 204 is mounted on the first table part 202. Furthermore, the second table part 204 is configured to be moved up and down with respect to the first table part 202 using a guide rail as a guide mechanism and a ball screw as a drive transmission mechanism (not shown) installed in the first table part 202.

The second driving part 205 is formed of a motor or the like as a driving source for moving the second table part 204 up and down. The second driving part 205 is connected to the ball screw as a drive transmission mechanism in the first table part 202 through a connection mechanism (coupling or the like) (not shown).

The vessel support part 206 is mounted on the second table part 204, and is formed of an arm or the like for supporting the pod 16 to be transferred.

As described above, the pod transfer device 20 is configured such that the first table part 202 and the second table part 204 can be each moved up and down. That is, by controlling the operations of the first table part 202 and the second table part 204, the pod 16 can be transferred in two stages of a vertical movement of the first table part 202 and a vertical movement of the second table part 204. Thus, it is possible to cope with a longer transfer distance, as compared to a case where the pod 16 is transferred in only one stage.

Meanwhile, in the pod transfer device 20, a certain strength is required for the main body base part 201 and the first table part 202. In addition, the second table part 204 needs to alleviate even a slight load applied to the main body base part 201 and the first table part 202. Therefore, it is possible to lengthen a stroke (sliding length) by adopting a configuration having a certain strength to the first table part 202 on the main body base part 201. On the other hand, the stroke of the second table part 204 may be set shorter than the stroke of the first table part 202 so as to reduce the load by reducing the weight in some embodiments. In order to realize such a stroke length, a total length of the main body base part 201 may be set longer than a total length of the first table part 202 in some embodiments. Similarly, it is desirable that the total length of the first table part 202 be set longer than the total length of the second table part 204.

For example, the ratio between the stroke of the first table part 202 and the stroke of the second table part 204 is set to 2:1.

In that case, in order to synchronously move the first table part 202 and the second table part 204, the lead ratio of each ball screw is also set to 2:1 so that the first driving part 203 and the second driving part 205 are operated at the same rotation number. Thus, it is possible to smoothly move both the first table part 202 and the second table part 204 up and down over the entire stroke. Here, operating the first driving part 203 and the second driving part 205 at the same rotation number means that one control signal can be supplied to each of them. That is, by using only one command from a higher controller, it is possible to make the synchronous operation of the first table part 202 and the second table part 204 run smoothly.

Furthermore, even if the lead ratio of each ball screw is set to 1:1, it is possible to meet smooth operation of the first table part 202 and the second table part 204 by setting the gear ratio of the first driving part 203 and the second driving part 205 to 2:1. Here, it is needless to say that each gear ratio is not limited to 2:1 but may be freely selected as appropriate.

Separate control signals may be supplied to the first driving part 203 and the second driving part 205, respectively.

For example, a case where the first table part 202 is raised by a distance A by controlling the first driving part 203 and the second table part 204 is raised by a distance B by controlling the second driving part 205 is considered. In that case, as a result, the second table part 204 is raised by A+B. In this manner, when the operation is controlled by sending separate control signals to the first driving part 203 and the second driving part 205, it is possible to realize the division of roles between the first table part 202 and the second table part 204. Specifically, by dividing the roles of each, it is possible to perform fine position adjustment which is difficult to realize when synchronously operating each of them.

In addition, the first driving part 203 and the second driving part 205 may be configured so that a driving torque of the first driving part 203 is larger than a driving torque of the second driving part 205 in some embodiments. As described above, it may be considered to configure in a manner that the stroke of the first table part 202 is increased while having a certain strength, whereas the stroke of the second table part 204 is reduced while reducing the weight. This is because, if the driving torque of the first driving part 203 is larger than the driving torque of the second driving part 205, this configuration can be suitably coped with.

Furthermore, the pod transfer device 20 is configured not only to move the pod 16 to be transferred up and down in the vertical direction but also to move the pod 16 in the rotation direction when viewed from the plane. Thus, the pod transfer device 20 can transfer the pod 16 to be transferred to and from each of the pod stage 18, the rotary pod shelf 22a, the stacked pod shelf 22b, and the pod opener 24.

(Positional Relationship between the Pod Shelf and the Pod Transfer Device)

Here, a positional relationship between the rotary pod shelf 22a and the stacked pod shelf 22b, and the pod transfer device 20 will be described.

The rotary pod shelf 22a is disposed in the first shelf region which is a region above the pod opener 24, the transfer chamber 50, or the like. Therefore, when trying to increase the number of stages of shelf boards of the rotary pod shelf 22a, the uppermost shelf board is disposed closer to a ceiling surface of the housing 12.

Furthermore, the stacked pod shelf 22b is disposed in the second shelf region below the pod stage 18. Since the pod stage 18 is used for transferring the pod 16 to and from an external device, its height position is determined by a semiconductor equipment and materials international (SEMI) standard. Therefore, when trying to increase the number of stages of shelf boards of the stacked pod shelf 22b, the lowermost shelf board is disposed closer to the bottom surface of the housing 12.

The uppermost position at which the pod transfer device 20 can move vertically is necessary to correspond to the uppermost shelf board of the rotary pod shelf 22a and the lowermost position at which it can move vertically is necessary to correspond to the lowermost shelf board of the stacked pod shelf 22b.

Figure 4A:
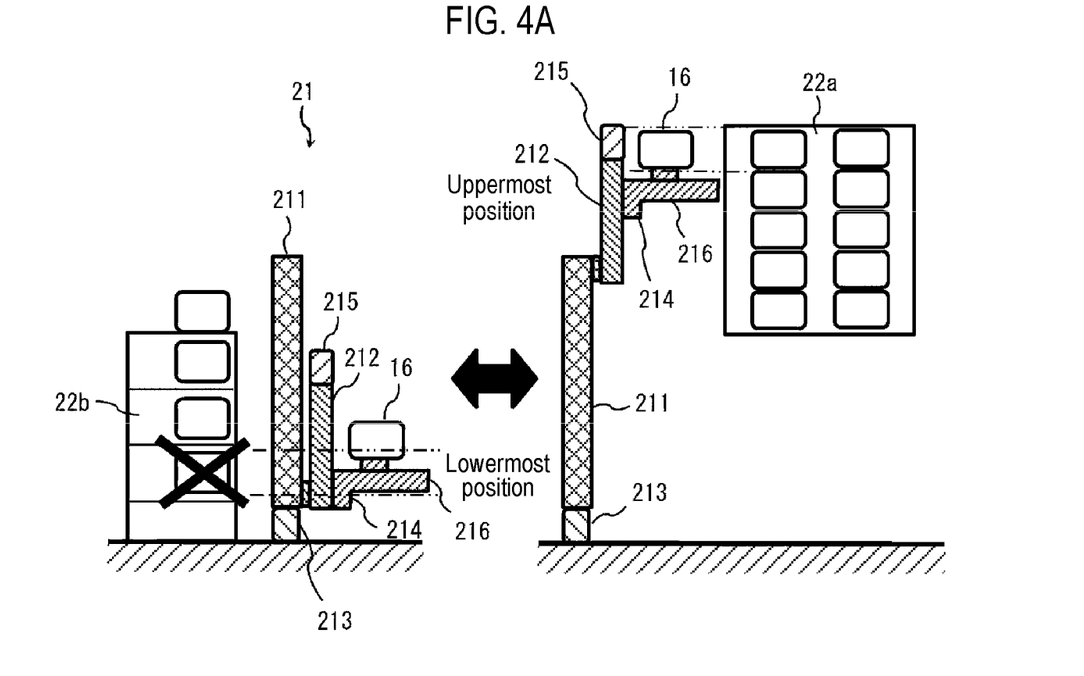
FIGS. 4A and 4B are side cross sectional views schematically illustrating a positional relationship between a pod shelf and a pod transfer device in a substrate processing apparatus according to a comparative example of the present disclosure.
Figure 4B:
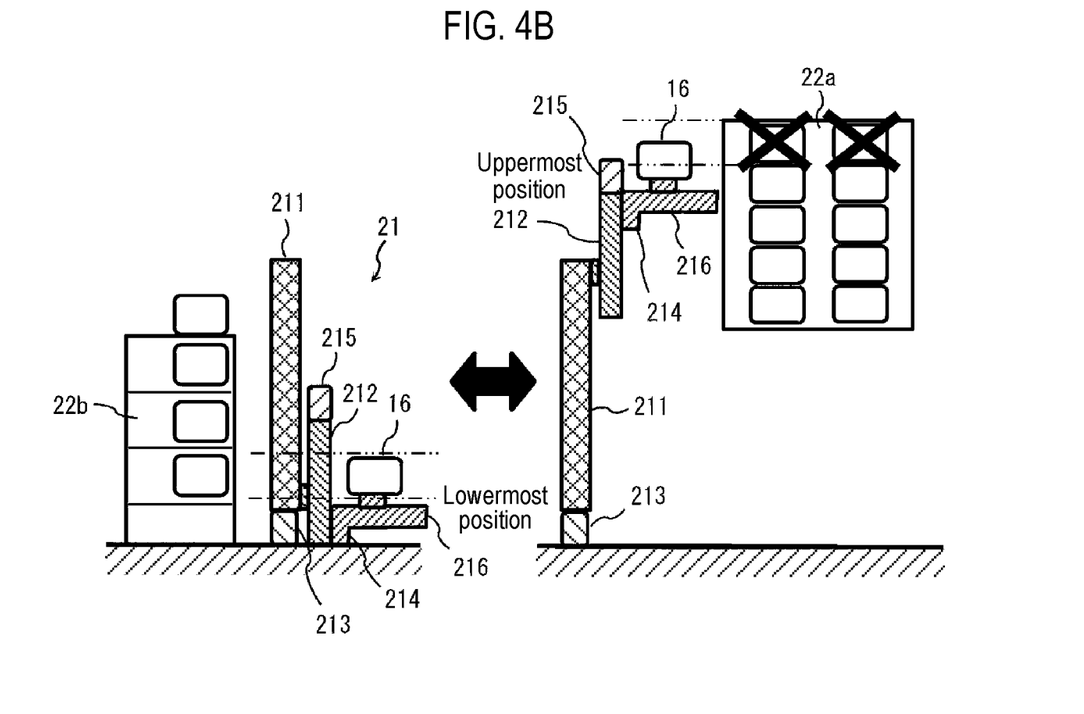

FIGS. 4A and 4B are side sectional views schematically illustrating a positional relationship between a pod shelf and a pod transfer device in a substrate processing apparatus according to a comparative example.

In a pod transfer device 21 of the substrate processing apparatus according to the comparative example, a first driving part 213 as a driving source for moving a first table part 212 up and down is disposed to be connected to the lower side of a main body base part 211.

For example, as illustrated in FIG. 4A, a moving region of the pod transfer device 21 having such a configuration to the lower side of the first table part 212 is restricted as much as the first driving part 213 is disposed on the bottom surface of the housing, and thus the lowermost position at which the pod 16 can be transferred becomes high. Therefore, there may be a possibility that the pod transfer device 21 cannot pick up the pod 16 mounted on the lowermost shelf board of the stacked pod shelf 22b (see, the symbol x in the drawing). In addition, if it is attempted to enable the pickup of the pod 16, the lowermost shelf board of the stacked pod shelf 22b must be raised, which may cause a reduction in the number of pods 16 that the stacked pod shelf 22b can store.

In this regard, for example, as illustrated in FIG. 4B, it may be considered that the first table part 212 is mounted so as to be offset downward with respect to the main body base part 211 as much as the first driving part 213 is disposed. However, if the first table part 212 is offset downward, the uppermost position at which the pod 16 can be transferred may be lowered by the offset. Therefore, there may be a possibility that the pod transfer device 21 cannot pick up the pod 16 mounted on the uppermost shelf board of the rotary pod shelf 22a (see, the symbol x in the drawing). In addition, if it is attempted to enable the pickup of the pod 16, the uppermost shelf board of the rotary pod shelf 22a must be lowered, which may cause a reduction in the number of pods 16 that the rotary pod shelf 22a can store.

Therefore, in the present embodiment, the first driving part 203 of the pod transfer device 20 is disposed at an upper position of the main body base part 201. The "upper position" referred to herein may include not only an upper position of the upper end of the main body base part 201 but also a position of a region near the upper end of the main body base part 201. Specifically, for example, the state of being disposed at the upper position may include not only a case where the first driving part 203 is located above the upper end of the main body base part 201 but also a case where the first driving part 203 is located in a region near the upper end of the main body base part 201 through a drive transmission mechanism such as a gear or a belt so that the driving shaft of the first driving part 203 and the ball screw for moving the first table part 202 are coaxial. In this manner, if the first driving part 203 is disposed at the upper position of the main body base part 201, there is no case where the first driving part 203 may be located below the lower end of the main body base part 201 as in the configuration of the comparative example described above.

Figure 5:
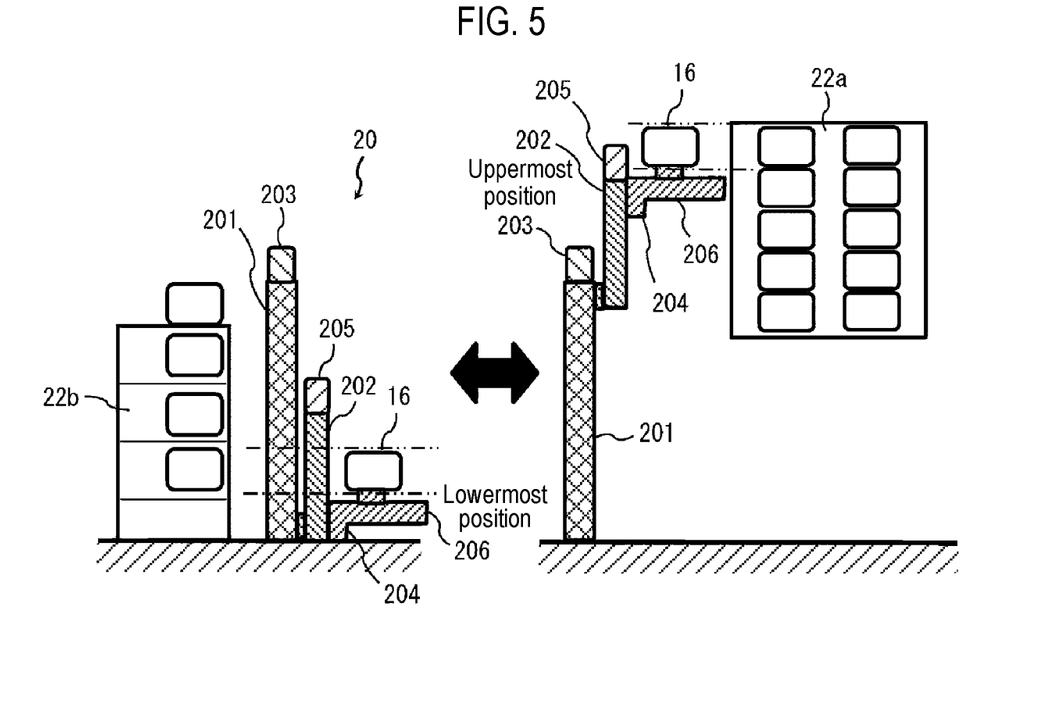
FIG. 5 is a side cross sectional view schematically illustrating a positional relationship between a pod shelf and a pod transfer device in the substrate processing apparatus according to an embodiment of the present disclosure.

FIG. 5 is a side cross sectional view schematically illustrating a positional relationship between the pod shelf and the pod transfer device in the substrate processing apparatus according to one embodiment of the present disclosure.

As described above, the first driving part 203 is disposed at the upper position of the main body base part 201. Therefore, it is possible to dispose the main body base part 201 so that the lower end of the main body base part 201 is located on the bottom surface of the housing 12. Moreover, when disposing the main body base part 201 in this manner, any special processing is not required on the bottom surface of the housing 12, a floor surface of a clean room where the substrate processing apparatus 10 is installed, and the like.

If the main body base part 201 is disposed on the bottom surface of the housing 12, the pod transfer device 20 can set the lowermost position at which it can move vertically to a low level. Therefore, even if the lowermost shelf board of the stacked pod shelf 22b is disposed closer to the bottom surface of the housing 12, the pod transfer device 20 can pick up the pod 16 mounted on the lowermost shelf board.

Furthermore, since there is no need to offset the first table part 202 downward with respect to the main body base part 201 and then mount it, the pod transfer device 20 will not have a case where the uppermost position at which it can move vertically may be lowered by the offset. That is, even if the uppermost shelf board of the rotary pod shelf 22a is disposed closer to the ceiling surface of the housing 12, the pod transfer device 20 can pick up the pod 16 mounted on the uppermost shelf board.

As described above, if the first driving part 203 is disposed at the upper position of the main body base part 201, the uppermost position at which the pod transfer device 20 can move vertically may correspond to the uppermost shelf board of the rotary pod shelf 22a, and the lowermost position at which it can move vertically is enabled to correspond to the lowermost shelf board of the stacked pod shelf 22b. Therefore, the substrate processing apparatus 10 configured to include the pod transfer device 20 can properly cope with an increase in the number of pods 16 that can be stored (stocked) according to the multi-stage of the rotary pod shelf 22a and the stacked pod shelf 22b, and as a result, a processing efficiency of the wafers 14 can be improved.

The first driving part 203 is connected to the ball screw as a drive transmission mechanism for moving the first table part 202 up and down through a connection mechanism (coupling or the like). Therefore, if the first driving part 203 is disposed at the upper position of the main body base part 201, for example, even when a trouble such as a failure or like occurs in the first driving part 203, it is possible to separate the first driving part 203 from the main body base part 201 only by releasing the connection state through the connection mechanism. On the other hand, if the first driving part 213 is disposed at the lower side of the main body base part 211 as in the comparative example described above, it may entail difficulty in separating the first driving part 213 from the main body base part 211. That is, as in the present embodiment, if the first driving part 203 is disposed at the upper position of the main body base part 201, since the maintenance can be performed on the first driving part 213 using the space above the main body base part 201, it becomes possible to realize easy maintenance work without entailing any difficulty as in the case of the comparative example described above.

The second driving part 205, which is a driving source for moving the second table part 204 up and down, is configured as a separate driving source from the first driving part 203. Furthermore, it may be considered that the first driving part 203 and the second driving part 205 are configured to be independently controlled.

By doing so, for example, when the pod 16 is transferred for a long distance, both the first driving part 203 and the second driving part 205 may be operated, and when the pod 16 is transferred for a short distance, one of the first driving part 203 and the second driving part 205 may be operated. More specifically, since the first table part 202 has a long stroke and the driving torque of the first driving part 203 is large, when operating the first driving part 203 to move the first table part 202, the transfer speed tends to increase. On the other hand, since the second table part 204 has a short stroke and the driving torque of the second driving part 205 is small, when operating the second driving part 205 to move the second table part 204, the transfer speed tends to decrease. Based on this, for example, it may be considered that, in the case of long distance transfer, both the first driving part 203 and the second driving part 205 are operated, and in the case of short distance transfer, only the second driving part 205 is operated.

Therefore, in the pod transfer device 20, it is possible to easily realize fine position adjustment by realizing the division of roles between the movement operation of the first table part 202 and the movement operation of the second table part 204. Moreover, it is also possible to realize power saving, improved transfer efficiency, particle reduction or the like through the division of roles between the first table part 202 and the second table part 204. For example, by including a state in which only one of the first driving part 203 and the second driving part 205 is operated, it is possible to realize power saving as compared to a case where both of them are always operated. Furthermore, by dividing the roles of the first driving part 203 and the second driving part 205, it is possible to improve the transfer efficiency. In addition, although the movement operation of each table part 202 or 204 may cause generation of particles due to sliding, by including a state of operating only one of them, it becomes possible to suppress generation of particles as compared to a case where both of them are always operated.

In that case, similar to the first driving part 203, it may be considered that the second driving part 205 is configured to be disposed at the upper position of the first table part 202. However, the present disclosure is not limited thereto, and the second driving part 205 may be disposed at a lower position of the first table part 202. The "lower position" referred to herein may include not only a position lower than the lower end of the first table part 202 but also a position of a region near the lower end of the first table part 202.

The first table part 202 is configured to be moved up and down with respect to the main body base part 201. Therefore, depending on a relative mounting position of the first table part 202 with respect to the main body base part 201, even if the second driving part 205 is disposed at the lower position of the first table part 202, the pod transfer device 20 can set the lowermost position at which it can move vertically to a lower level. Furthermore, even if the second driving part 205 is disposed at the lower position of the first table part 202, when the first table part 202 is moved upward, the space for maintenance of the second driving part 205 can be sufficiently secured.

That is, the second driving part 205 may be disposed at either the upper position or the lower position of the first table part 202.

(Clean Air Unit)

The substrate processing apparatus 10 is configured such that a down-flow from the upper side toward the bottom side occurs in a region inside the housing 12 where the pod transfer device 20 is disposed.

Specifically, as illustrated in FIG. 3, in the region inside the housing 12 where the pod transfer device 20 is disposed, a clean air unit 61 for causing a flow of cleaned air (clean air) is installed near the ceiling surface of the housing 12 as a portion of an air flow generating part that causes the down-flow. In the region inside the housing 12 where the pod transfer device 20 is disposed, an air flow exhaust port 62 for exhausting an atmosphere in the region is installed near the bottom surface of the housing 12 as another portion of the air flow generating part that causes the down-flow.

With this configuration, in the region inside the housing 12 where the pod transfer device 20 is disposed, the flow of clean air occurs from the upper side toward the bottom side to cause the down-flow. Therefore, even when particles may be generated from the pod transfer device 20 due to the movement of the first table part 202 or the second table part 204, the particles are discharged out of the housing 12 by the down-flow, thereby suppressing an influence of the particles from reaching the pod 16 or the like.

The flow of the clean air caused by the clean air unit 61 and the air flow exhaust port 62 may be circulated not only in the region inside the housing 12 where the pod transfer device 20 is disposed but also near the rotary pod shelf 22a, the stacked pod shelf 22b, or the like.

Furthermore, the pod transfer device 20 may have a configuration that makes it difficult to discharge particles or the like out of the apparatus in some embodiments.

Figure 6:
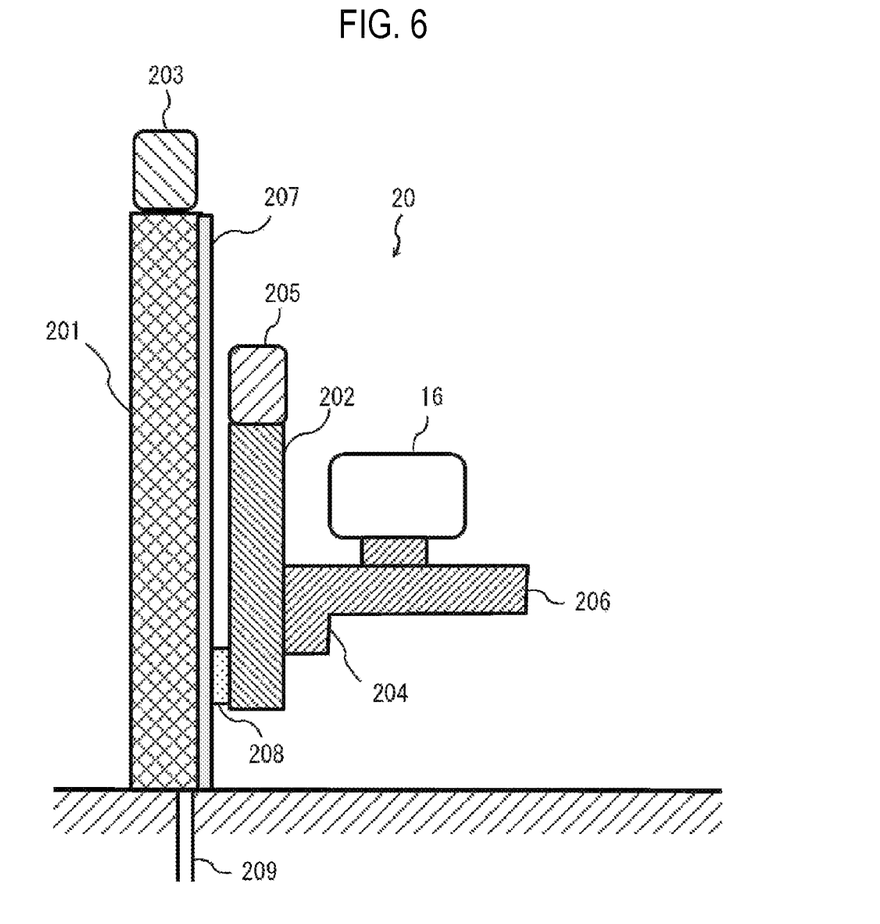
FIG. 6 is a schematic view illustrating a configuration of a cover of the pod transfer device in the substrate processing apparatus according to an embodiment of the present disclosure.

FIG. 6 is a schematic view illustrating a configuration of a cover of the pod transfer device in the substrate processing apparatus according to one embodiment of the present disclosure.

Specifically, it may be considered that, in the pod transfer device 20, a cover 207 that minimizes holes (slits) necessary for the first table part 202 to be moved up and down is installed, a bellows-like cover 208 covering a connection part between the main body base part 201 and the first table part 202 is installed, or a local exhaust mechanism 209 for making the internal space of the main body base part 201 on which a guide rail, a ball screw or the like is disposed at a negative pressure is installed, as a configuration that makes it difficult to discharge the particles or the like out of the apparatus.

With this configuration, it is difficult for the pod transfer device 20 to discharge the particles or the like to its peripheral region, appropriately suppressing the influence of particles or the like from reaching the pod 16 or the like.

(Controller)

Figure 7:
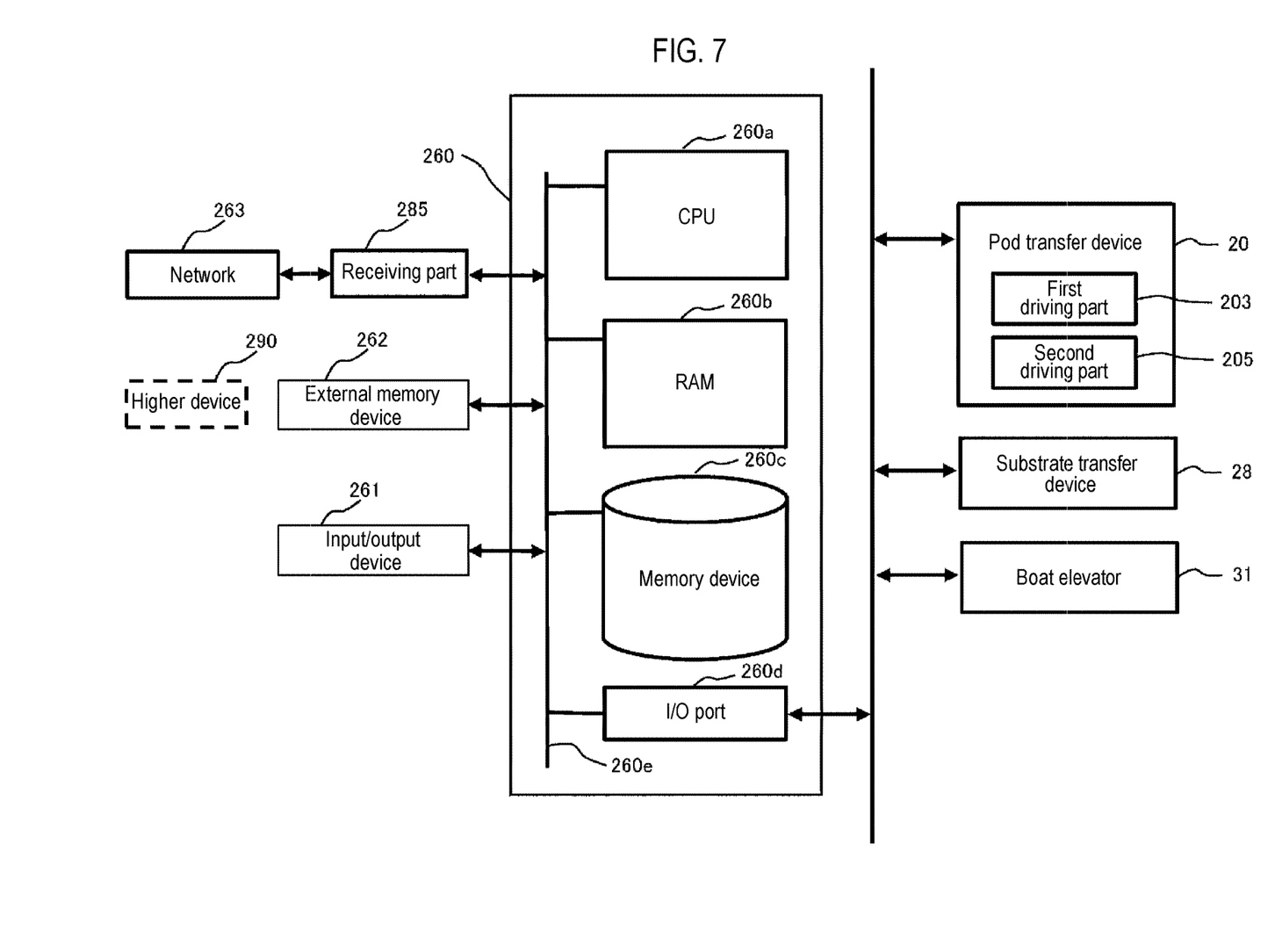
FIG. 7 is a block diagram schematically illustrating a configuration example of a controller of the substrate processing apparatus according to an embodiment of the present disclosure.

Next, a controller 260 that controls the operations of the respective parts described above will be described. The controller 260 serves to control the entire operation of the substrate processing apparatus 10. Therefore, the operations of the first driving part 203 and the second driving part 205 in the pod transfer device 20 are also controlled by the controller 260.

FIG. 7 is a block diagram schematically illustrating a configuration example of the controller of the substrate processing apparatus according to one embodiment of the present disclosure.

The controller 260 may be configured as a computer including a central processing unit (CPU) 260a, a random access memory (RAM) 260b, a memory device 260c, and an I/O port 260d. The RAM 260b, the memory device 260c and the I/O port 260d are configured to exchange data with the CPU 260a via an internal bus 260e. An input/output device 261 formed of, e.g., a touch panel or the like, and an external memory device 262 are configured to be connected to the controller 260. Information may be input from the input/output device 261 to the controller 260. Furthermore, the input/output device 261 is configured to display and output the information under the control of the controller 260. It is also configured such that a network 263 can be connected to the controller 260 via a receiving part 285. This means that the controller 260 can also be connected to a higher device 290 such as a host computer existing over the network 263.

The memory device 260c is configured by, for example, a flash memory, a hard disk drive (HDD), or the like. A control program for controlling operations of the substrate processing apparatus 10, a process recipe for specifying sequences and conditions of substrate processing, operation data or processing data generated during a process for setting the process recipe used for processing the wafer 14, or the like is readably stored in the memory device 260c. The process recipe functions as a program for causing the controller 260 to execute each sequence in the substrate processing to obtain a predetermined result. Hereinafter, the process recipe and the control program will be generally and simply referred to as a "program." When the term "program" is used herein, it may indicate a case of including only the process recipe, a case of including only the control program, or a case of including both the process recipe and the control program. The RAM 260b is configured as a memory area (work area) in which a program, operation data or processing data read by the CPU 260a is temporarily stored.

The CPU 260a serving as an operation part is configured to read the control program from the memory device 260c and execute the same. The CPU 260a also reads the process recipe from the memory device 260c according to an input of an operation command from the input/output device 261. The CPU 260a also calculates operation data by comparing and operating a set value input from the receiving part 285 and the process recipe or control data stored in the memory device 260c. The CPU 260a also executes a process of determining corresponding processing data (process recipe) from the operation data, or the like. In addition, the CPU 260a is configured to control the operations of the respective parts in the substrate processing apparatus 10 according to the contents of the process recipe thus read.

The controller 260 is not limited to a case of being configured as a dedicated computer, but may be configured as a general-purpose computer. For example, the controller 260 according to the present embodiment may be configured, for example, by installing, on the general-purpose computer, the aforementioned program stored in the external memory device 262 (for example, a magnetic tape, a magnetic disk such as a flexible disk or a hard disk, an optical disc such as a CD or DVD, a magneto-optical disc such as an MO, or a semiconductor memory such as a USB memory or a memory card). However, means for supplying the program to the computer is not limited to the case of using the external memory device 282 to supply the program. For example, the program may be supplied to the computer using a communication means such as the network 263 (the Internet or a dedicated line), instead of using the external memory device 262. The memory device 260c or the external memory device 262 is configured as a computer-readable recording medium. Hereinafter, the memory device 260c and the external memory device 262 will be generally and simply referred to as a "recording medium." When the term "recording medium" is used herein, it may indicate a case of including only the memory device 260c, a case of including only the external memory device 262, or a case of including both the memory device 260c and the external memory device 262.

Meanwhile, the I/O port 260d of the controller 260 is connected at least to the pod transfer device 20, the substrate transfer device 28, the boat elevator 31 for moving the boat 30 up and down, and the like. Accordingly, the controller 260 can perform the operation control of the pod transfer device 20 including the driving of the first driving part 203 and the second driving part 205, the transfer control of the wafer 14 by the substrate transfer device 28, the control of moving the boat 30 by the boat elevator 31 up and down, and the like.

That is, the controller 260 causes the CPU 260a to read the program from the memory device 260c and execute the same so that the following processes are performed on the pod transfer device 20, the substrate transfer device 28, the boat elevator 31, and the like constituting the substrate processing apparatus 10.

Specifically, the controller 260 causes the substrate processing apparatus 10 to execute, by a function of the computer:

(i) transferring the pod 16 from the pod stage 18 to at least one of the rotary pod shelf 22a and the stacked pod shelf 22b using the pod transferring device 20 and storing the pod 16 in the rotary pod shelf 22a or the stacked pod shelf 22b, (ii) transferring the pod 16 stored in the rotary pod shelf 22a or the stacked pod shelf 22b from the rotary pod shelf 22a or the stacked pod shelf 22b to the pod opener 24 using the pod transfer device 20, (iii) discharging the wafer 14 from the pod 16 transferred to the pod opener 24 using the substrate transfer device 28 and supporting the discharged wafer 14 in the boat 30, in the transfer chamber 50, and (iv) loading the boat 30 charged with the wafer 14 into the process chamber 42 (boat loading) and processing the wafer 14 in the process chamber 42.

In addition, the controller 260 causes the substrate processing apparatus 10 to execute, by the function of the computer, (v) unloading the boat 30 charged with the processed wafer 14 from the interior of the process chamber 42 (boat unloading), (vi) discharging the processed wafer 14 supported by the boat 30 using the substrate transfer device 28 and accommodating it in the pod 16 supported by the pod opener 24, in the transfer chamber 50, (vii) transferring the pod 16 accommodating the processed wafer 14 from the pod opener 24 to the rotary pod shelf 22a or the stacked pod shelf 22b using the pod transfer device 20, and (viii) transferring the pod 16 accommodating the processed wafer 14 from the rotary pod shelf 22a or the stacked pod shelf 22b to the pod stage 18 using the pod transfer device 20.

(5) Effects According to the Present Embodiment

According to the present embodiment, one or more effects as set forth below may be achieved.

(a) In the present embodiment, since the substrate processing apparatus 10 includes the stacked pod shelf 22b in addition to the rotary pod shelf 22a, it is possible to cope with an increase in the number of pods 16 that can be stored in the substrate processing apparatus 10, thus improving the processing efficiency of the wafer 14.

Moreover, in the present embodiment, the pod transfer device 20 for transferring the pod 16 performs the transfer of the pod 16 in two stages of the vertical movement of the first table part 202 and the vertical movement of the second table part 204. Therefore, it is possible to cope with an increase of the transfer distance of the pod 16, thus dealing with an increase in the number of pods 16 that can be stored in the substrate processing apparatus 10.

In addition, in the present embodiment, the first driving part 203 of the pod transfer device 20 is disposed at the upper position of the main body base part 201. Therefore, since the pod transfer device 20 can set the lowermost position at which it can move vertically to a low level, there is also no possibility that the uppermost position at which it can move vertically will be lowered. That is, the pod transfer device 20 can appropriately cope with an increase in the number of pods 16 that can be stored according to the multi-stage of the rotary pod shelf 22a and the stacked pod shelf 22b.

As described above, in the present embodiment, it is possible to cope with an increase in the number of pods 16 that can be stored in the substrate processing apparatus 10, and as a result, it is possible to improve the processing efficiency of the wafer 14.

(b) In the present embodiment, the first driving part 203 and the ball screw as a drive transmission mechanism for moving the first table part 202 up and down are connected at the upper side of the main body base part 201 with the connection mechanism (coupling or the like). Thus, even when a trouble such as a failure or the like occur in, for example, the first driving part 203, it is possible to separate the first driving part 203 from the main body base part 201 merely by releasing the connection state through the connection mechanism. That is, since the maintenance can be performed on the first driving part 203 using the space above the main body base part 201, it is possible to realize easy maintenance work.

(c) In the present embodiment, the first driving part 203 and the second driving part 205 in the pod transfer device 20 are respectively configured as separate driving sources, and are also configured so as to be independently controlled. Thus, it is possible to divide the roles of the first table part 202 and the second table part 204 in the pod transfer device 20, and to easily realize fine position adjustment. Moreover, it is also possible to realize power saving, improved transfer efficiency, particle reduction and the like through the division of roles between the first table part 202 and the second table part 204.

(d) In the present embodiment, the second driving part 205 may be disposed at the upper position of the first table part 202 or at the lower position of the first table part 202. Since the first table part 202 is configured to be moved up and down with respect to the main body base part 201, even when the second driving part 205 is disposed at, for example, the lower position of the first table part 202, it is possible to set the lowermost position at which it can move vertically to a low level and to secure a sufficient space for maintenance. That is, it is possible to sufficiently secure the degree of freedom of arrangement for the second driving part 205.

(e) In the present embodiment, the first driving part 203 and the second driving part 205 are configured such that the driving torque of the first driving part 203 is larger than the driving torque of the second driving part 205. Thus, for example, in the case where the pod transfer device 20 is configured such that the stroke of the first table part 202 is increased while having a certain strength, and the stroke of the second table part 204 is reduced while reducing the weight, it is possible to appropriately cope with the pod transfer device 20 having such a configuration.

(f) In the present embodiment, in the region inside the housing 12 where the pod transfer device 20 is disposed, it is configured such that a down-flow due to the flow of clean air occurs from the upper side toward the bottom side. Thus, even when particles may be generated from the pod transfer device 20 due to the movement of the first table part 202 or the second table part 204, it is possible to suppress the influence of the particles from reaching the pod 16 or the like by discharging the particles out of the housing 12 by the down-flow.

OTHER EMBODIMENTS

While the embodiment of the present disclosure has been specifically described above, the present disclosure is not limited to the aforementioned embodiment but may be differently modified without departing from the spirit of the present disclosure.

In the aforementioned embodiment, there has been described a case where a thin film is mainly formed on the wafer surface as the substrate processing by way of example, but the present disclosure is not limited thereto. That is, the present disclosure may also be applied to a process of forming a film other than the thin film exemplified in the aforementioned embodiment, in addition to the formation of the thin film exemplified in the aforementioned embodiment. In addition, the present disclosure may be applied to a case where not only the film-forming process but also other substrate processing such as heat treatment (annealing treatment), plasma treatment, diffusion treatment, oxidation treatment, nitriding treatment, lithography treatment or the like is performed, regardless of the specific contents of the substrate processing.

Furthermore, in the aforementioned embodiment, there has been described a case where processing is performed on a wafer, which is one of the processes for manufacturing a semiconductor device, as an example, but the present disclosure is not limited thereto. That is, the substrate to be processed is not limited to the wafer but may be a photo mask, a printed wiring board, a liquid crystal panel, a magnetic disk, an optical disc, or the like.

According to the present disclosure in some embodiments, it is possible to appropriately cope with an increase in storage capacity of a transfer vessel.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A substrate processing apparatus, comprising:
a transfer region configured to communicate with a process chamber in which substrates are processed;
a first shelf region installed above the transfer region, and having a first shelf configured to store a plurality of transfer vessels configured to accommodate the substrates;

a second shelf region installed below a stage part on which the transfer vessels to be transferred to and from an external device are loaded, and having a second shelf that is a stacked shelf having a plurality of stages of shelf boards and that is configured to stack and store the transfer vessels; and a transfer vessel transfer robot installed inside a housing that accommodates the transfer region, the first shelf region and the second shelf region, and configured to transfer the transfer vessels to and from the stage part, the first shelf, the second shelf, and the transfer region, wherein the transfer vessel transfer robot includes:
- a main body base part installed on a bottom surface of the housing;
- a first table part configured to be moved up and down with respect to the main body base part;
- a first driving part disposed at an upper position of the main body base part and configured to serve as a driving source for moving the first table part up and down;
- a second table part mounted on the first table part and configured to be moved up and down with respect to the first table part;
- a second driving part configured to serve as a driving source for moving the second table part up and down; and
- a vessel support part mounted on the second table part and configured to support the transfer vessels to be transferred.

2. The apparatus of claim 1, wherein the first driving part is connected to a drive transmission mechanism configured to move the first table part up and down at an upper side of the main body base part through a connection mechanism.

3. The apparatus of claim 2, wherein the first driving part and the second driving part are respectively configured as the driving sources separate from each other and are respectively configured to be independently controlled.

4. The apparatus of claim 3, wherein the second driving part is disposed at either an upper position or a lower position of the first table part.

5. The apparatus of claim 4, wherein a driving torque of the first driving part is larger than a driving torque of the second driving part.

6. The apparatus of claim 5, further comprising an air flow generating part configured to generate a down-flow from an upper side toward a bottom side in a region inside the housing where the transfer vessel transfer robot is disposed.

7. The apparatus of claim 3, wherein a driving torque of the first driving part is larger than a driving torque of the second driving part.

8. The apparatus of claim 2, wherein the second driving part is disposed at either an upper position or a lower position of the first table part.

9. The apparatus of claim 8, wherein a driving torque of the first driving part is larger than a driving torque of the second driving part.

10. The apparatus of claim 2, wherein a driving torque of the first driving part is larger than a driving torque of the second driving part.

11. The apparatus of claim 1, wherein the first driving part and the second driving part are respectively configured as the driving sources separate from each other and are respectively configured to be independently controlled.

12. The apparatus of claim 11, wherein the second driving part is disposed at either an upper position or a lower position of the first table part.

13. The apparatus of claim 12, wherein a driving torque of the first driving part is larger than a driving torque of the second driving part.

14. The apparatus of claim 11, wherein a driving torque of the first driving part is larger than a driving torque of the second driving part.

15. The apparatus of claim 1, wherein the second driving part is disposed at either an upper position or a lower position of the first table part.

16. The apparatus of claim 15, wherein a driving torque of the first driving part is larger than a driving torque of the second driving part.

17. The apparatus of claim 1, wherein a driving torque of the first driving part is larger than a driving torque of the second driving part.

18. The apparatus of claim 1, further comprising an air flow generating part configured to generate a down-flow from an upper side toward a bottom side in a region inside the housing where the transfer vessel transfer robot is disposed.

19. The apparatus of claim 1, further comprising the stage part configured to load thereon the transfer vessels to be transferred to and from the external device.

* * * * *